(12) United States Patent
Seo

(10) Patent No.: US 8,232,571 B2
(45) Date of Patent: Jul. 31, 2012

(54) LIGHT EMITTING DEVICE HAVING PLURALITY OF LIGHT EMITTING CELLS AND METHOD OF FABRICATING THE SAME

(75) Inventor: Won Cheol Seo, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 309 days.

(21) Appl. No.: 12/623,968

(22) Filed: Nov. 23, 2009

(65) Prior Publication Data

US 2010/0155693 A1  Jun. 24, 2010

(30) Foreign Application Priority Data

Dec. 24, 2008  (KR) .................. 10-2008-0132750

(51) Int. Cl.
*H01L 33/00* (2010.01)

(52) U.S. Cl. ............... 257/98; 257/96; 257/97; 438/34; 438/42

(58) Field of Classification Search ............. 257/96–98; 438/34, 42
See application file for complete search history.

(56) References Cited

U.S. PATENT DOCUMENTS

| 7,095,061 | B2 | 8/2006 | Steigerwald et al. |
| 7,417,259 | B2 | 8/2008 | Sakai et al. |
| 7,709,849 | B1 | 5/2010 | Kal et al. |
| 7,723,736 | B2 * | 5/2010 | Lee et al. ........................ 257/88 |
| 7,838,891 | B2 | 11/2010 | Lee et al. |
| 7,846,755 | B2 | 12/2010 | Kal et al. |
| 7,880,181 | B2 | 2/2011 | Yoon et al. |
| 2008/0087902 | A1 | 4/2008 | Lee et al. |
| 2009/0039359 | A1 | 2/2009 | Yoon et al. |
| 2009/0085048 | A1 | 4/2009 | Lee et al. |
| 2009/0267085 | A1 | 10/2009 | Lee et al. |
| 2009/0283787 | A1 | 11/2009 | Donofrio et al. |
| 2010/0078656 | A1 * | 4/2010 | Seo et al. ........................ 257/88 |
| 2010/0117111 | A1 | 5/2010 | Illek et al. |
| 2010/0148190 | A1 * | 6/2010 | Kim et al. ...................... 257/88 |

(Continued)

FOREIGN PATENT DOCUMENTS

JP  2004-006582  1/2004

(Continued)

OTHER PUBLICATIONS

Non-Final Office Action of U.S. Appl. No. 12/123,162 dated on Aug. 5, 2010.

(Continued)

*Primary Examiner* — Telly Green

(74) *Attorney, Agent, or Firm* — H.C. Park & Associates, PLC

(57) ABSTRACT

Disclosed are a light emitting device having a plurality of light emitting cells and a method of fabricating the same. The light emitting device comprises a plurality of light emitting cells positioned on a substrate to be spaced apart from one another. Each of the light emitting cells comprises a first conductive-type upper semiconductor layer, an active layer and a second conductive-type lower semiconductor layer. Electrodes are positioned between the substrate and the light emitting cells, and each of the electrodes has an extension extending toward adjacent one of the light emitting cells. An etching prevention layer is positioned in regions between the light emitting cells and between the electrodes. Each wire has one end connected to the upper semiconductor layer and the other end connected to the electrode through the etching prevention layer.

11 Claims, 5 Drawing Sheets

U.S. PATENT DOCUMENTS

| | | |
|---|---|---|
| 2010/0163887 A1 | 7/2010 | Kim et al. |
| 2010/0163900 A1 | 7/2010 | Seo et al. |
| 2010/0244060 A1 | 9/2010 | Lee et al. |
| 2011/0140135 A1 | 6/2011 | Lee et al. |
| 2011/0169040 A1 | 7/2011 | Seo et al. |
| 2011/0175129 A1 | 7/2011 | Lee et al. |

FOREIGN PATENT DOCUMENTS

| | | |
|---|---|---|
| JP | 2008-130656 | 6/2008 |
| JP | 2008-141015 | 6/2008 |
| KR | 100599012 | 7/2006 |
| KR | 10-0838197 | 6/2008 |
| KR | 10-2010-0016631 | 2/2010 |
| KR | 10-2010-0036617 | 4/2010 |
| KR | 10-2010-0079843 | 7/2010 |
| WO | 2004/023568 | 3/2004 |
| WO | 2007/001124 | 1/2007 |

OTHER PUBLICATIONS

Notice of Allowance of U.S. Appl. No. 12/123,162 dated on Nov. 30, 2010.
Non-Final Office Action of U.S. Appl. No. 12/623,990 dated on Jan. 19, 2012.
Notice of Allowance of U.S. Appl. No. 12/624,011 dated on Jan. 24, 2012.
Notice of Allowance of U.S. Appl. No. 12/623,990 dated Apr. 27, 2012.
International Search Report of PCT/KR2011/006544 dated May 1, 2012.
Written Opinion of PCT/KR2011/006544 dated May 1, 2012.
Non-Final Office Action dated Apr. 13, 2012 for U.S. Appl. No. 13/345,348 issued.

* cited by examiner

PRIOR ART

LIGHT EMITTING DEVICE HAVING PLURALITY OF LIGHT EMITTING CELLS AND METHOD OF FABRICATING THE SAME

CROSS REFERENCE TO RELATED APPLICATION

This application claims priority from and the benefit of Korean Patent Application No. 10-2008-0132750, filed on Dec. 24, 2008, which is hereby incorporated by reference for all purposes as if fully set forth herein.

BACKGROUND OF THE INVENTION

1. Field of the Invention

Exemplary embodiments of the present invention relate to a light emitting device and a method of fabricating the same, and more particularly, to a light emitting device having a plurality of light emitting cells and a method of fabricating the same.

2. Discussion of the Background

GaN-based light emitting diodes (LEDs) are widely used for display and backlights. Further, LEDs have less electric power consumption and a longer lifespan as compared with conventional light bulbs or fluorescent lamps, so that the LEDs have been substituted for conventional incandescent bulbs and fluorescent lamps and their application areas have been expanded to the use thereof for general illumination.

Recently, LEDs, which are directly connected to a high-voltage DC or AC power source to emit light, have been commercialized. For example, an LED capable of being directly connected to a high-voltage DC or AC power source is disclosed in PCT Patent Publication No. WO 2004/023568A1 (SAKAI et. al.), entitled "LIGHT-EMITTING DEVICE HAVING LIGHT-EMITTING ELEMENTS."

According to PCT Patent Publication No. WO 2004/023568A1, LEDs are two-dimensionally connected on a single insulative substrate such as a sapphire substrate to form serial LED arrays. Such serial LED arrays can be driven by a high-voltage DC power source. Further, there is provided a single-chip light emitting device capable of being driven by a high-voltage AC power source by allowing such LED arrays to be connected in reverse parallel on the sapphire substrate.

Since the light emitting device has light emitting cells formed on a substrate used as a growth substrate, e.g., a sapphire substrate, the light emitting cells have a limitation in structure, and there is a limitation in improving light extraction efficiency. To solve such a problem, a method of fabricating a light emitting device having a plurality of light emitting cells using a substrate separation process is disclosed in Korean Patent No. 10-0599012, entitled "LIGHT EMITTING DIODE HAVING THERMAL CONDUCTIVE SUBSTRATE AND METHOD OF FABRICATING THE SAME."

FIG. 1, FIG. 2, FIG. 3, and FIG. 4 are sectional views illustrating a method of fabricating a light emitting device according to the prior art.

Referring to FIG. 1, semiconductor layers comprising a buffer layer 23, an n-type semiconductor layer 25, an active layer 27 and a p-type semiconductor layer 29 are formed on a sacrificial substrate 21. A first metal layer 31 is formed on the semiconductor layers, and a second metal layer 53 is formed on a substrate 51 that is separate from the sacrificial substrate 21. The first metal layer 31 may comprise a reflective metal layer. The second metal layer 53 is joined with the first metal layer 31 so that the substrate 51 is bonded on the semiconductor layers.

Referring to FIG. 2, after the substrate 51 is bonded, the sacrificial substrate 21 is separated by a laser lift-off process. Also, after the sacrificial substrate 21 is separated, the remaining buffer layer 23 is removed, and a surface of the n-type semiconductor layer 25 is exposed.

Referring to FIG. 3, the semiconductor layers 25, 27 and 29 and the metal layers 31 and 53 are patterned using photolithography and etching techniques to form metal patterns 40 spaced apart from one another and light emitting cells 30 positioned on regions of the respective metal patterns 40. Each of the light emitting cells 30 comprises a patterned p-type semiconductor layer 29a, a patterned active layer 27a and a patterned n-type semiconductor layer 25a.

Referring to FIG. 4, metal wires 57 are formed to electrically connect top surfaces of the light emitting cells 30 to the metal patterns 40 adjacent thereto. The metal wires 57 allow the light emitting cells 30 to be connected therethrough, thereby forming a serial array of light emitting cells. Electrode pads 55 for connecting the metal wires 57 may be formed on the n-type is semiconductor layers 25a. Electrode pads (not shown) may also be formed on the metal patterns 40. Two or more arrays may be formed and these arrays are connected in reverse parallel, so that an LED capable of being driven by an AC power source is provided.

According to the prior art, thermal dissipation performance of the LED can be improved since the substrate 51 can be selected from a variety of substrates, and light extraction efficiency can be enhanced by treating a surface of the n-type semiconductor layer 25a. Further, a first metal layer 31a comprises a reflective metal layer and reflects light traveling from the light emitting cells 30 toward the substrate 51, so that the light emitting efficiency can be further improved.

However, in the prior art, while the semiconductor layers 25, 27 and 29 and the metal layers 31 and 53 are patterned, etching byproducts of a metallic material may be stuck to side walls of the light emitting cells 30, and therefore, a short circuit between the n-type semiconductor layer 25a and the p-type semiconductor layer 29a may occur. Further, a surface of the first metal layer 31a, which is exposed while the semiconductor layers 25, 27 and 29 are etched, may be easily damaged by plasma. When the first metal layer 31 a comprises a reflective metal layer such as Ag or Al, such etching damage may be serious. Since the surface of the metal layer 31a is damaged by plasma, the adhesion of the wires 57 or electrode pads formed on the metal layer 31a is lowered, resulting in a device failure.

Meanwhile, according to the prior art, the first metal layer 31 may comprise a reflective metal layer, thereby reflecting light traveling from the light emitting cells 30 toward the substrate 51. However, etching damage may occur on the reflective metal layers that are exposed to a space between the light emitting cells 30, and the reflective metal layers may be easily oxidized due to their exposure to the outside. Particularly, the oxidation of the exposed reflective metal layers is not limited to the exposed portions but progresses toward regions below the light emitting cells 30, thereby lowering reflectivity of the reflective metal layers.

SUMMARY OF THE INVENTION

Exemplary embodiments of the present invention provide a light emitting device having a plurality of light emitting cells, in which a short circuit in a light emitting cell due to metallic etch byproducts can be prevented, and a method of fabricating the same.

Exemplary embodiments of the present invention also provide a light emitting device, in which a reflective metal layer can be prevented from being deteriorated due to etching or oxidation, and a method of fabricating the same.

Additional features of the invention will be set forth in the description which follows, and in part will be apparent from the description, or may be learned by practice of the invention.

An exemplary embodiment of the present invention discloses a light emitting device comprising a substrate and a plurality of light emitting cells positioned on the substrate to be spaced apart from one another. Each of the light emitting cells comprises a first conductive-type upper semiconductor layer, an active layer and a second conductive-type lower semiconductor layer. Electrodes are positioned between the substrate and the light emitting cells to be spaced apart from one another. The respective electrodes are electrically connected to the corresponding second conductive-type lower semiconductor layers. Each of the electrodes has an extension extending toward an adjacent one of the light emitting cells. An etching prevention layer is positioned in regions between the light emitting cells and between the electrodes. The etching prevention layer has at least a portion extending toward regions below edges of adjacent light emitting cells, and the etching prevention layer has openings through which the extensions of the electrodes are exposed. The light emitting device also comprises a side insulating layer for covering sides of the light emitting cells; and wires for electrically connecting the light emitting cells. The wires are spaced apart from the sides of the light emitting cells by the side insulating layer. Each of the wires has one end electrically connected to the upper semiconductor layer of one of the light emitting cells and the other end electrically connected to the electrode electrically connected to the lower semiconductor layer of another adjacent one of the light emitting cells through the opening of the etching prevention layer.

An exemplary embodiment of the present invention also discloses a method of fabricating a light emitting device having a plurality of light emitting cells, the method comprises forming compound semiconductor layers on a sacrificial substrate. The compound semiconductor layers comprise a first conductive-type semiconductor layer, a second conductive-type semiconductor layer and an active layer interposed therebetween. The first conductive-type semiconductor layer is disposed close to the sacrificial substrate. The method includes forming an etching prevention layer on the compound semiconductor layers. The etching prevention layer has openings through which the second conductive-type semiconductor layer is exposed. The method includes forming electrodes to be filled in the openings of the etching prevention layer. Each of the electrodes has an extension extending to a top of the etching prevention layer, the electrodes being spaced apart from one another. The method includes forming an interlayer insulating layer on the electrodes. The method includes bonding a substrate to the interlayer insulating layer; removing the sacrificial substrate to expose the first conductive-type semiconductor layer. The method includes patterning the compound semiconductor layers so that the etching prevention layer is exposed, thereby forming a plurality of light emitting cells spaced apart from one another. The method further includes forming a side insulating layer for covering the light emitting cells and exposing at least a portion of an upper surface of the first conductive-type semiconductor layer, and patterning the etching prevention layer to form openings through which the electrodes are exposed. The method further includes forming wires for connecting the first conductive-type semiconductor layer to the exposed electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
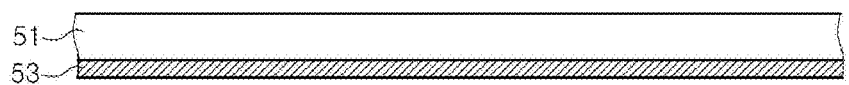
FIG. 1, FIG. 2, FIG. 3, and FIG. 4 are sectional views illustrating a method of fabricating a light emitting device having a plurality of light emitting cells according to a related art.
Figure 1:
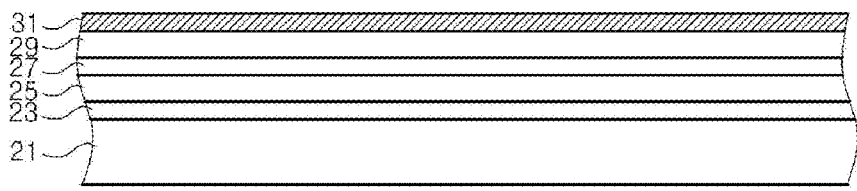
Figure 2:
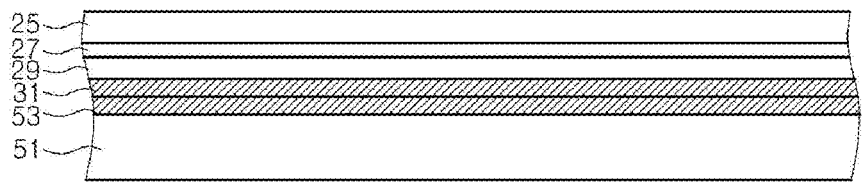
Figure 3:
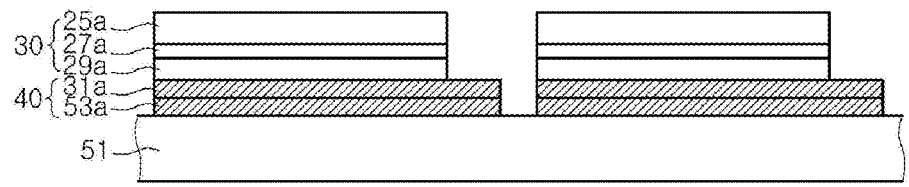
Figure 4:
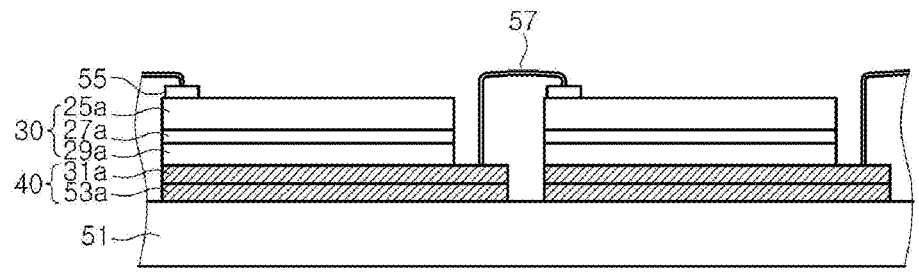

Hereinafter, the invention will be described in detail with reference to the accompanying drawings, in which embodiments of the invention are shown. The following embodiments are provided so that this disclosure is thorough, and will fully convey the scope of the invention to those skilled in the art. Therefore, the invention should not be construed as limited to the following embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

Figure 5:
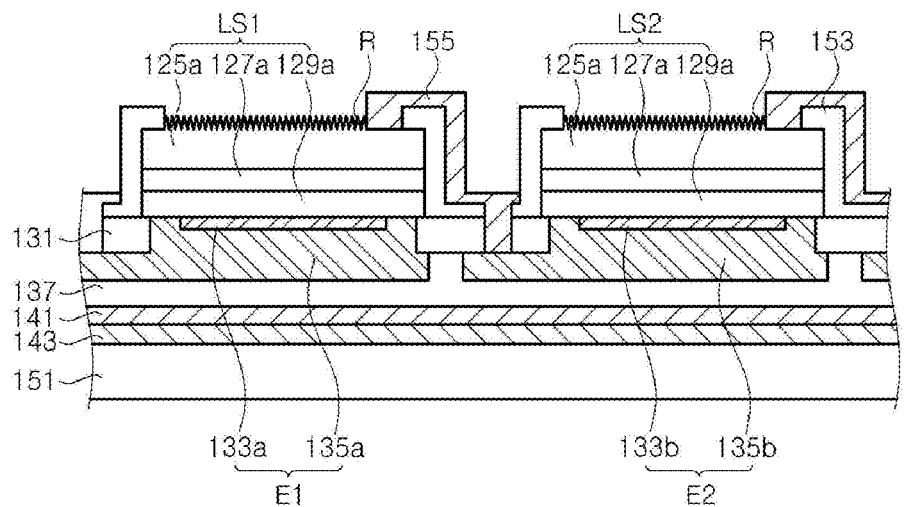
FIG. 5 is a sectional view illustrating a light emitting device having a plurality of light emitting cells according to an exemplary embodiment of the present invention.

FIG. 5 is a sectional view illustrating a light emitting device having a plurality of light emitting cells according to an exemplary embodiment of the present invention.

Referring to FIG. 5, the light emitting device comprises a substrate 151, a plurality of light emitting cells LS1 and LS2, wires 155, electrodes E1 and E2, an etching prevention layer 131 and a side insulating layer 153. The light emitting device may comprise an interlayer insulating layer 137 and bonding metals 141 and 143.

The substrate 151 is differentiated from a growth substrate for growing compound semiconductor layers thereon and is a bonding substrate bonded to compound semiconductor layers which have been previously grown. The bonding substrate 151 may be a sapphire substrate, but it is not limited thereto. That is, the bonding substrate 151 may be another kind of insulative or conductive substrate. Particularly, it is preferable that a sapphire substrate is used as the bonding substrate 151 so that the bonding substrate 151 has the same thermal expansion coefficient as the growth substrate.

The plurality of light emitting cells LS1 and LS2 are positioned on the substrate 151 to be spaced apart from each other. Each of the light emitting cells LS1 and LS2 comprises a first conductive-type upper semiconductor layer 125a, an active layer 127a and a second conductive-type lower semiconductor layer 129a. The active layer 127a is interposed between the upper semiconductor layer 125a and the lower semiconductor layer 129a. The lower semiconductor layer 129a and the upper semiconductor layer 125a may have the same area.

The active layer 127a, the upper semiconductor layer 125a, and the lower semiconductor layer 129a may each be formed of a III-N compound semiconductor, e.g., an (Al, Ga, In)N semiconductor. Each of the upper semiconductor layer 125a and the lower semiconductor layer 129a may be formed to have a single- or multi-layered structure. For example, the upper semiconductor layer 125a and/or the lower semiconductor layer 129a may comprise a contact layer and a clad layer and also comprise a superlattice layer. The active layer 127a may be formed to have a single or multiple quantum well structure. Preferably, the first conductive type semiconductor is an n-type, and the second conductive type semiconductor is a p-type. The upper semiconductor layers 125a can be formed of an n-type semiconductor layer having relatively low resistance, so that the thickness of the upper semiconductor layers 125a can be formed to be relatively thick. Accordingly, it is easy to form a roughened surface R on a surface of the upper semiconductor layer 125a. The roughened surface R enhances an extraction efficiency of light generated from the active layer 127a.

The electrodes E1 and E2 are positioned between the substrate 151 and the light emitting cells LS1 and LS2, respectively, to be spaced apart from each other. The electrode E1 is electrically connected to the lower semiconductor layer 129a of the light emitting cell LS1, and the electrode E2 is electrically connected to the lower semiconductor layer 129a of the light emitting cell LS2. Each of the electrodes E1 and E2 has an extension extending toward an adjacent light emitting cell. That is, the electrode E1 has an extension extending toward a light emitting cell (not shown) adjacent thereto, and the electrode E2 has an extension extending toward the light emitting cell LS1.

The electrodes E1 and E2 may have reflective layers 133a and 133b and protective metal layers 135a and 135b. The reflective layers 133a and 133b may be formed of a metallic material having high reflectivity, e.g., silver (Ag), aluminum (Al) or an alloy thereof. Further, the reflective layers 133a and 133b may be formed to have a multi-layered structure of layers having different refractive indices. In this case, the reflective layers 133a and 133b may have through-holes, and the protective metal layers 135a and 135b may be connected to the light emitting cells LS1 and LS2 through the through-holes. The reflective layers 133a and 133b may be in direct contact with the lower semiconductor layers 129a of the light emitting cells LS1 and LS2, respectively. However, another ohmic contact layer may be interposed between the reflective layers 133a and 133b and the lower semiconductor layers 129a. The protective metal layers 135a and 135b cover the reflective layers to prevent the reflective layers from being exposed to the outside. The protective metal layers 135a and 135b may each be formed of a single layer or multiple layers, for example of Ni, Ti, Ta, Pt, W, Cr, Pd or the like. As shown in this figure, each of the protective metal layers 135a and 135b may extend to the outside thereby forming an extension.

The etching prevention layer 131 is positioned in regions between the light emitting cell LS1 and the light emitting cell LS2 and between the electrode E1 and the electrode E2. That is, the etching prevention layer 131 is positioned at the bottoms of spaces defined by the separation of the light emitting cells LS1 and LS2. The etching prevention layer 131 prevents the extensions of the electrodes E1 and E2 from being exposed to the separated regions. At least a portion of the etching prevention layer 131 may extend toward regions below edges of the adjacent light emitting cells LS1 and LS2. The entire etching prevention layer 131 may be positioned under the bottom surfaces of the light emitting cells LS1 and LS2. However, as a modification, a portion of the etching prevention layer 131 may protrude to the region between the light emitting cells LS1 and LS2. The etching prevention layer 131 is formed of an insulating layer, such as a silicon oxide layer or a silicon nitride layer.

The extensions of the electrodes E1 and E2 extend below the etching prevention layer 131, and the etching prevention layer 131 has openings through which the extensions of the electrodes E1 and E2 are exposed. These openings provide passages through which the wires 155 can be electrically connected to the electrodes E1 and E2.

The side insulating layer 153 covers sides of the light emitting cells LS1 and LS2 to thereby prevent the upper and lower semiconductor layers 125a and 129a of the light emitting cells LS1 and LS2 from being short-circuited by the wires 155. Further, the side insulating layer 153 may partially cover the top surfaces of the light emitting cells LS1 and LS2 and may extend toward a top of the etching prevention layer 131. In this case, the side insulating layer 153 has openings for allowing the openings of the etching prevention layer 131 to be exposed therethrough.

The wires 155 electrically connect the light emitting cells LS1 and LS2 to each other, thereby forming a serial array. Each of the wires 155 has one end electrically connected to the upper semiconductor layer 125a of one of the light emitting cells and the other end electrically connected to an electrode that is electrically connected to the lower semiconductor layer 129a of another adjacent one of the light emitting cells. For example, one end of the wire 155 is electrically connected to the upper semiconductor layer 125a of the light emitting cell LS1, and the other end of the wire 155 is electrically connected to the electrode E2 through the opening of the etching prevention layer 131. Meanwhile, pads (not shown) may be formed on the upper semiconductor layers 125a and the electrodes E1 and E2 so that the wires 155 are electrically connected via the pads. The wires 155 are insulated from the sides of the light emitting cells LS1 and LS2 by the side insulating layer 153.

A serial array of the light emitting cells is formed on the substrate 151 by the wires 155. Accordingly, the serial array can be driven by being connected to a high-voltage DC power source. Alternatively, at least two serial arrays may be formed on the substrate 151 by the wires 155, so that these arrays are connected in reverse parallel to each other so that they may be driven by an AC power source. As another alternative, a serial array may be formed on a substrate by wires and connected to a bridge rectifier formed on the substrate, so that the serial array may be driven by an AC power source. The bridge rectifier may also be formed by connecting light emitting cells through wires.

The interlayer insulating layer 137 may be interposed between the substrate 151 and the electrodes E1 and E2, and bonding metals 141 and 143 may be interposed between the interlayer insulating layer 137 and the substrate 151. The interlayer insulating layer 137 prevents the electrodes E1 and E2 from being short-circuited to each other by the substrate 151 or the bonding metals 141 and 143.

The bonding metals 141 and 143 improve adhesion between the interlayer insulating layer 137 and the bonding substrate 151, thereby preventing the bonding substrate 151 from being separated from the interlayer insulating layer 137.

FIG. 6, FIG. 7, FIG. 8, FIG. 9, FIG. 10, FIG. 11, FIG. 12, FIG. 13, FIG. 14, and FIG. 15 are sectional views illustrating a method of fabricating a light emitting device having a plurality of light emitting cells according to an embodiment of the present invention.

Figure 6:
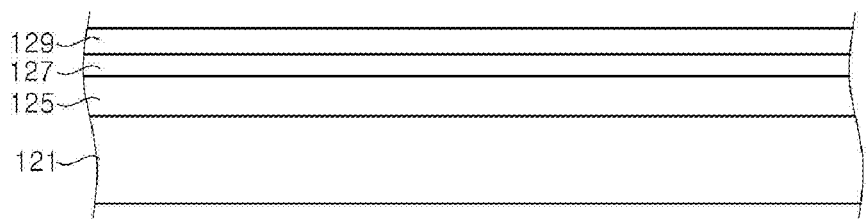
FIG. 6, FIG. 7, FIG. 8, FIG. 9, FIG. 10, FIG. 11, FIG. 12, FIG. 13, FIG. 14, and FIG. 15 are sectional views illustrating a method of fabricating a light emitting device having a plurality of light emitting cells according to an exemplary embodiment of the present invention.

Referring to FIG. 6, compound semiconductor layers are formed on a sacrificial substrate 121. The sacrificial substrate 121 may be a sapphire substrate, but it is not limited thereto. That is, the sacrificial substrate may be a heterogeneous substrate. In the meantime, the compound semiconductor layers comprise a first conductive-type semiconductor layer 125, a second conductive-type semiconductor layer 129 and an active layer 127 interposed therebetween. The first conductive-type semiconductor layer 125 is positioned close to the sacrificial substrate 121. Each of the first conductive-type semiconductor layer 125 and the second conductive-type semiconductor layer 129 may be formed to have a single- or multi-layered structure. Also, the active layer 127 may be formed to have a single or multiple quantum well structure.

The compound semiconductor layers may be formed of a III-N compound semiconductor and grown on the sacrificial substrate 121 through a process such as metal organic chemical vapor deposition (MOCVD) or molecular beam epitaxy (MBE).

Before the compound semiconductor layers are formed, a buffer layer (not shown) may be formed. The buffer layer may reduce lattice mismatch between the sacrificial substrate 121 and the compound semiconductor layers. The buffer layer may be a layer formed of a GaN-based material such as GaN or AN.

Figure 7:
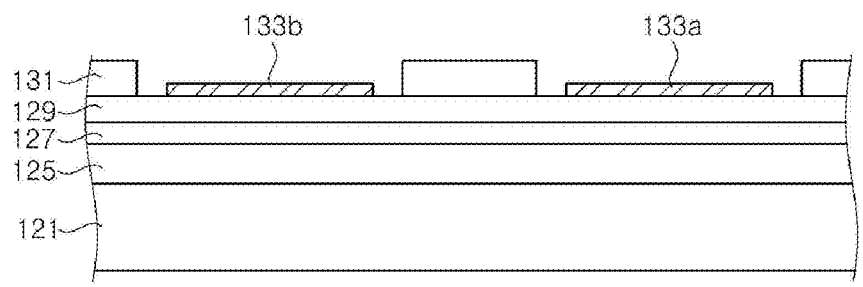

Referring to FIG. 7, an etching prevention layer 131 is formed on the compound semiconductor layers, e.g., the second conductive-type semiconductor layer 129. The etching prevention layer 131 has openings for allowing the second conductive-type semiconductor layer 129 to be exposed to the outside. The openings are formed on respective light emitting cell regions corresponding thereto and formed to have smaller areas than those of the light emitting cell regions.

The etching prevention layer 131 is formed by forming an insulating layer such as a silicon oxide layer or a silicon nitride layer on the second conductive-type semiconductor layer 129 and then patterning the insulating layer using photolithography and etching processes.

Reflective layers 133a and 133b are formed in the openings. The reflective layers 133a and 133b may be formed of a metallic material having high reflectivity, e.g., Ag, Al or an alloy thereof. Further, the reflective layers 133a and 133b may be formed by laminating layers having different refractive indices. When the reflective layers 133a and 133b are formed of a metal layer, they may be formed using a plating or deposition technique, e.g., a lift-off process.

Here, before the reflective layers 133a and 133b are formed, an ohmic contact layer (not shown) may be formed on the second conductive-type semiconductor layer 129. Alternatively, the reflective layers 133a and 133b may be formed before forming the etching prevention layer 131.

Figure 8:
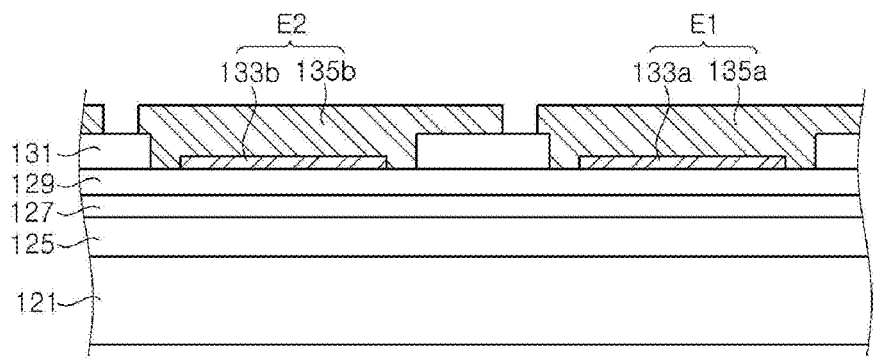

Referring to FIG. 8, protective metal layers 135a and 135b are formed to cover the reflective layers 133a and 133b, respectively. The respective protective metal layers 135a and 135b are filled in the openings of the etching prevention layer 131 and extend along the top surface of the etching prevention layer 131. The protective metal layers 135a and 135b are formed to be spaced apart from each other. The protective metal layers 135a and 135b may be formed of a single layer or multiple layers, e.g., of Ni, Ti, Ta, Pt, W, Cr, Pd or the like.

In this embodiment, the reflective layers 133a and 133b and the protective metal layers 135a and 135b constitute electrodes E1 and E2, respectively. However, the electrodes E1 and E2 are not limited thereto but may be formed of a single metal layer. For example, the formation of the reflective layers 133a and 133b may be omitted, and the electrodes E1 and E2 may be formed only of the protective metal layers 135a and 135b, respectively.

Figure 9:
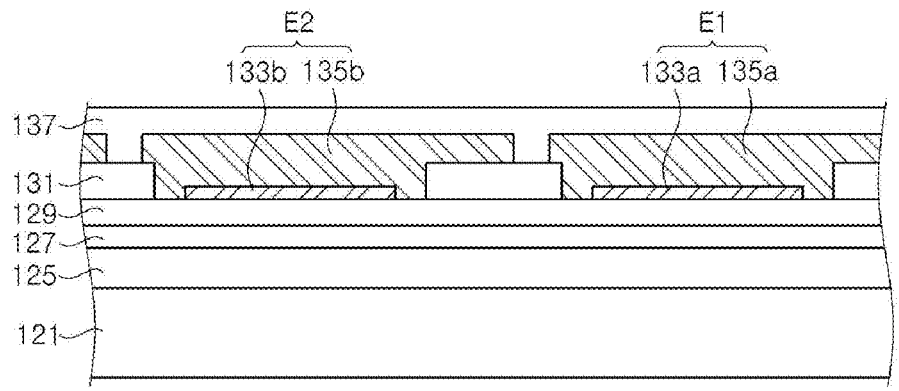

Referring to FIG. 9, an interlayer insulating layer 137 is formed over the electrodes E1 and E2. The interlayer insulating layer 137 covers the electrodes E1 and E2 and may be filled in gaps between the electrodes E1 and E2. A material of the interlayer insulating layer is not particularly limited, but may be formed of a silicon oxide layer or a silicon nitride layer.

Figure 10:
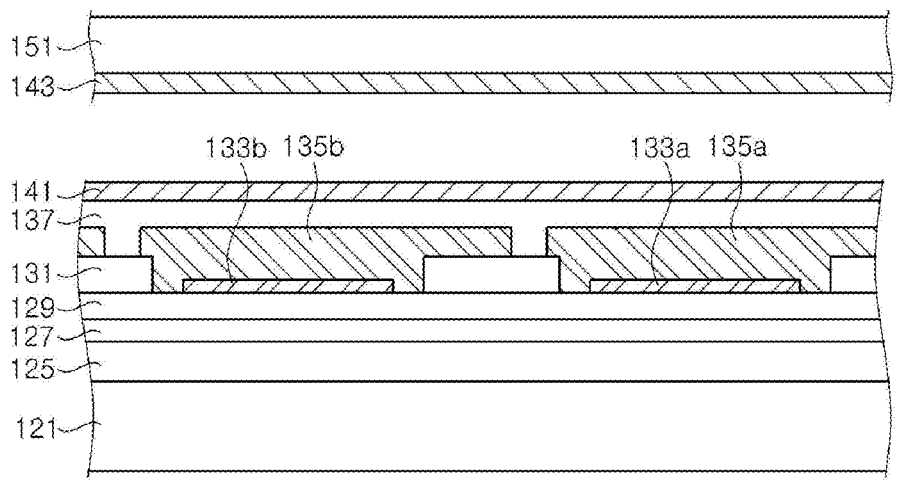

Referring to FIG. 10, a bonding metal 141 is formed on the interlayer insulating layer 137, and a bonding metal 143 is formed on an additional substrate 151. The bonding metal 141 may be formed of AuSn (80/20 wt %), for example. The substrate 151 is not particularly limited but may be a substrate, e.g., a sapphire substrate, which has a thermal expansion coefficient identical to that of the sacrificial substrate 121.

Figure 11:
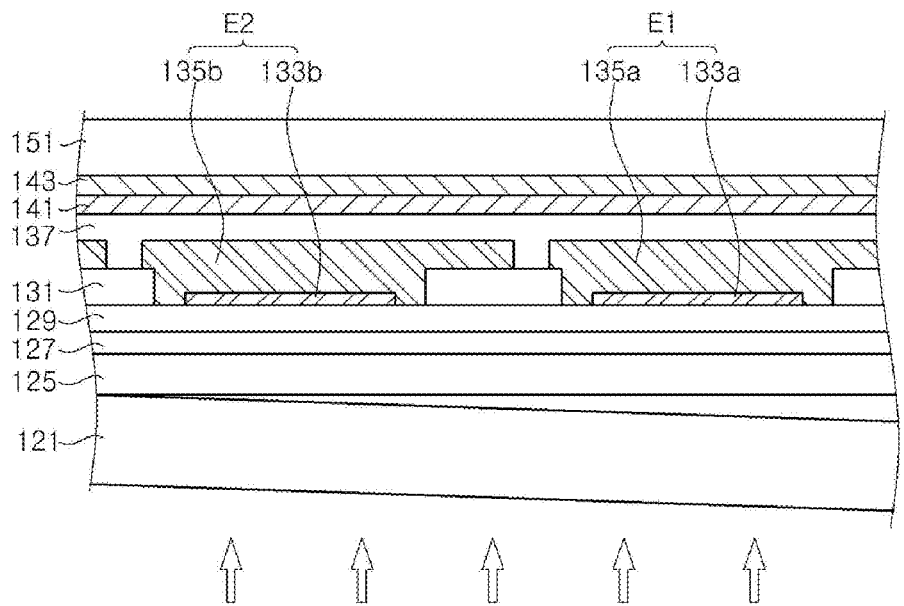
Figure 12:
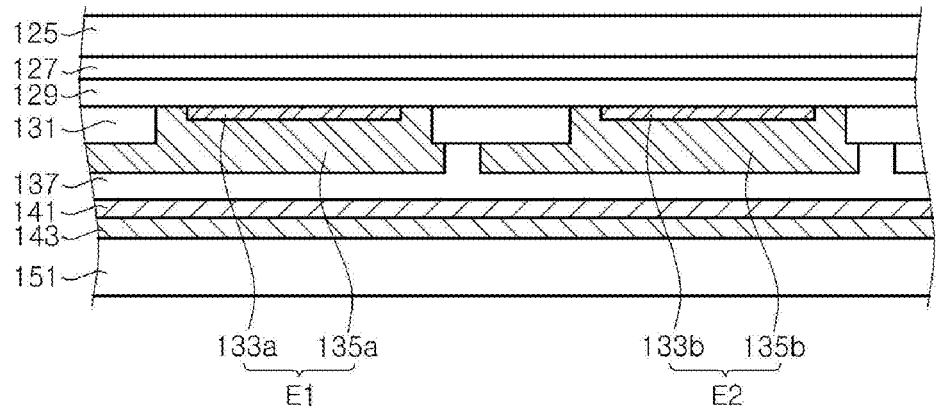

Referring to FIG. 11, the bonding metals 141 and 143 are bonded to face each other, so that the substrate 151 is bonded to the interlayer insulating layer 137. Subsequently, the sacrificial substrate 121 is removed, and the first conductive-type semiconductor layer 125 is exposed. The sacrificial substrate 121 may be separated using a laser lift-off (LLO) technique or other mechanical or chemical methods. At this time, the buffer layer, if present, is also removed so that the first conductive-type semiconductor layer 125 is exposed. FIG. 12 shows that the light emitting device is turned over so that the first conductive-type semiconductor layer 125 faces upward after the sacrificial substrate 121 is removed.

Figure 13:
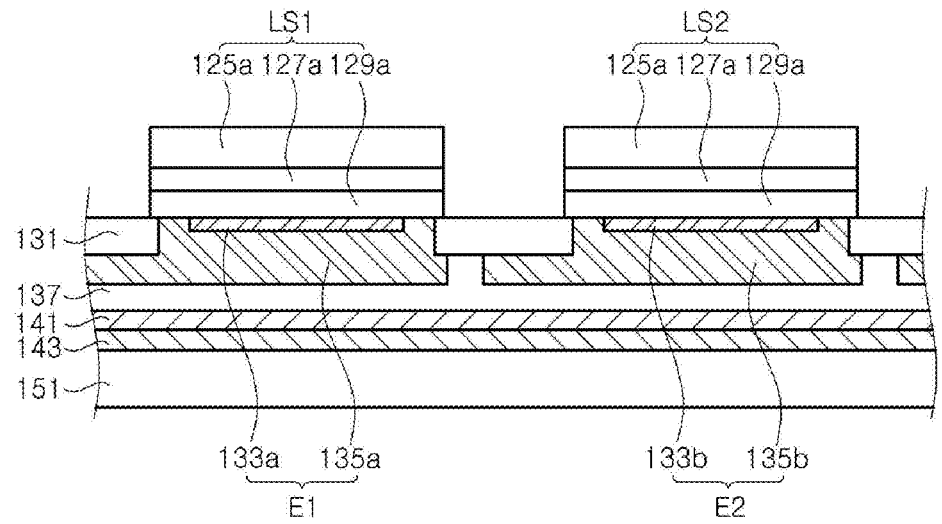

Referring to FIG. 13, a plurality of light emitting cells LS1 and LS2 are formed by patterning the compound semiconductor layers 125, 127, and 129. Each of the light emitting cells LS1 and LS2 comprises a patterned first conductive-type semiconductor layer 125a, patterned active layer 127a and a patterned second conductive-type semiconductor layer 129a. The compound semiconductor layers 125, 127, and 129 may be patterned using photolithography and etching processes, and such processes are generally known as a mesa etching process. At this time, portions of the compound semiconductor layers 125, 127, and 129 between the light emitting cells LS1 and LS2 are removed by the etching process, and the etching prevention layer 131 is exposed. The etching prevention layer 131 prevents the electrodes E1 and E2 formed thereunder from being exposed during the etching process. To this end, the etching is performed in a limited upper region of the etching prevention layer 131.

Figure 14:
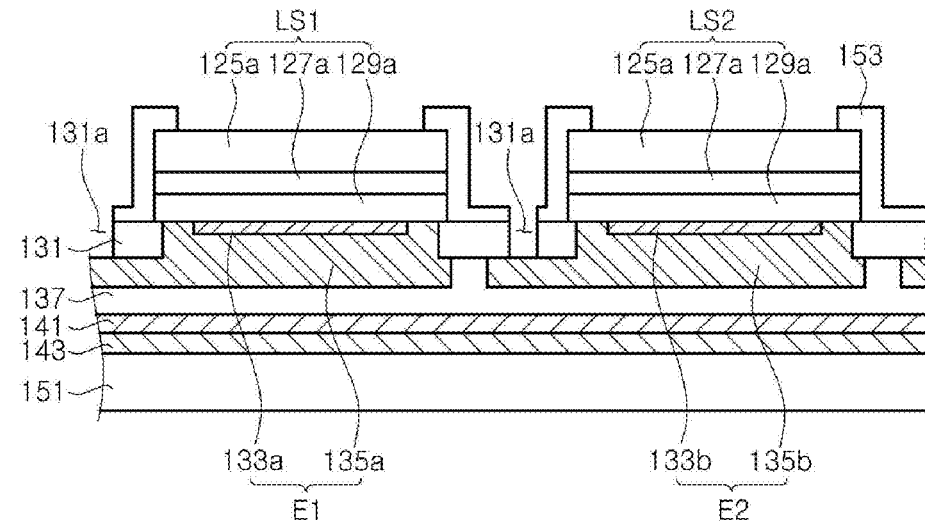

Referring to FIG. 14, a side insulating layer 153 is formed to cover sides of the light emitting cells LS1 and LS2. The side insulating layer 153 may be formed by forming an insulating layer for covering the light emitting cells LS1 and LS2 and then patterning the insulating layer using photolithography and etching processes. The side insulating layer 153 may be formed of $SiO_2$, SiN, MgO, TaO, $TiO_2$ or a polymer, for example. The side insulating layer 153 covers sides of the first conductive-type semiconductor layer 125a, the active layer 127a and the second conductive-type semiconductor layer 129a, i.e., the exposed sides of the light emitting cells LS1 and LS2. As shown in this figure, the side insulating layer 153 may also cover portions of the top surfaces of the light emitting cells LS1 and LS2. Further, the side insulating layer 153 may extend to an upper portion of the etching prevention layer 131. While or after the side insulating layer 153 is formed, openings 131a are formed in the etching prevention layer 131 to expose extensions of the electrodes E1 and E2.

Figure 15:
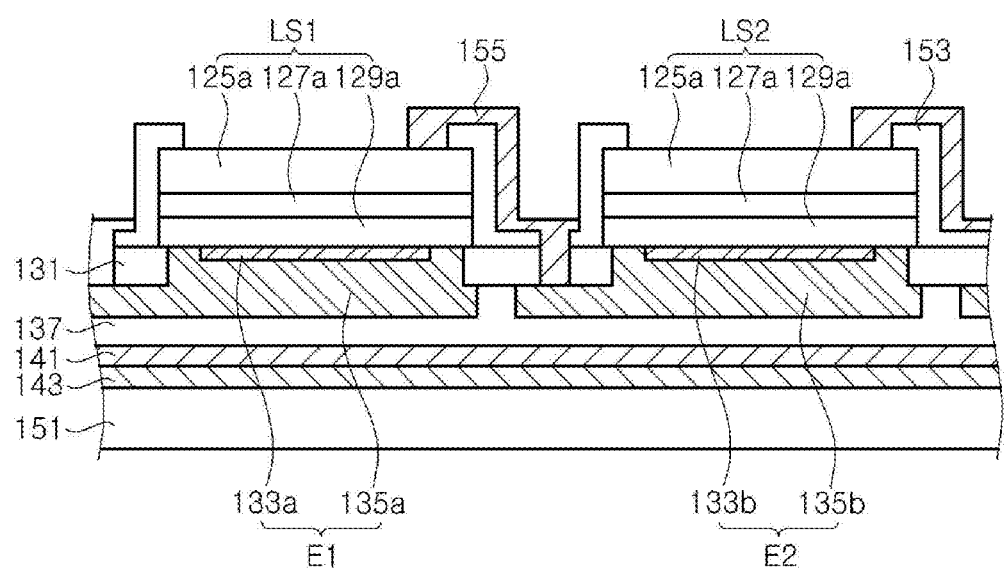

Referring to FIG. 15, wires 155 are formed to electrically connect the light emitting cells LS1 and LS2. The wire 155 electrically connects the first conductive-type semiconductor layer 125a of the light emitting cell LS1 to the electrode E2 that is electrically connected to the second conductive-type semiconductor layer 129a of the light emitting cell LS2. That is, one end of the wire 155 is electrically connected to the first conductive-type semiconductor layer 125a of the light emitting cell LS1, and the other end of the wire 155 is electrically connected to the electrode E2 that is electrically connected to the second conductive-type semiconductor layer 129a of the light emitting cell LS2.

Before the wires 155 are formed, pads (not shown) may be formed on the first conductive-type semiconductors 125a and/or the electrodes E1 and E2 so as to improve the adhesion or ohmic contact property of the wires 155.

Further, roughened surfaces R (FIG. 5) may be formed on the first conductive-type semiconductor layers 125a of the light emitting cells LS1 and LS2 using a photoelectrochemical (PEC) etching process or the like. The formation of the roughened surfaces R may be performed before forming the wires 155. Accordingly, the light emitting device of FIG. 5 is completed.

According to exemplary embodiments of the present invention, there can be provided a light emitting device having a plurality of light emitting cells, wherein metallic etch byproducts are prevented from being generated to thereby prevent a short-circuit in a light emitting cell, and a method of fabricating the same. Further, according to the present invention, a reflective layer is not exposed to the outside during an etching process, thereby making it possible to prevent the reflective layer from being deformed by etching or oxidation.

All publications, patent applications, accession numbers and other references cited in this specification are herein incorporated by reference as if each individual publication or patent application were specifically and individually indicated to be incorporated by reference.

Although the present invention has been described in connection with illustrated embodiments, the present invention is not to be construed as limited to the aforementioned embodiments. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting device comprising a plurality of light emitting cells, comprising:
   a substrate;
   a plurality of light emitting cells disposed on the substrate to be spaced apart from one another, each of the light emitting cells comprising a first conductive-type upper semiconductor layer, an active layer, and a second conductive-type lower semiconductor layer;
   a plurality of electrodes disposed on the substrate and between the substrate and each light emitting cell to be spaced apart from one another, the respective electrodes being electrically connected to the corresponding second conductive-type lower semiconductor layers, each of the electrodes having an extension extending toward an adjacent one of the light emitting cells;
   an etching prevention layer disposed in regions between adjacent light emitting cells and between adjacent electrodes, the etching prevention layer comprising openings that expose the extensions of the electrodes;
   a side insulating layer covering sides of the light emitting cells; and
   wires electrically connecting the light emitting cells, the wires being spaced apart from the sides of the light emitting cells by the side insulating layer, each of the wires having one end electrically connected to the upper semiconductor layer of one of the light emitting cells and the other end electrically connected to the electrode electrically connected to the lower semiconductor layer of another adjacent one of the light emitting cells through the opening of the etching prevention layer.

2. The light emitting device of claim 1, further comprising an interlayer insulating layer disposed on the substrate and between the substrate and the electrodes.

3. The light emitting device of claim 2, further comprising a metal bonding layer disposed on the substrate and between the substrate and the interlayer insulating layer, the metal bonding layer to bond the substrate to the interlayer insulating layer.

4. The light emitting device of claim 1, wherein each of the electrodes comprises a reflective layer and a protective metal layer.

5. The light emitting device of claim 4, wherein the reflective layer is disposed within a lower region of the lower semiconductor layer, and the protective metal layer covers side and lower surfaces of the reflective layer.

6. The light emitting device of claim 1, wherein at least one of the upper semiconductor layers has a roughened surface.

7. The light emitting device of claim 1, wherein the substrate is a sapphire substrate.

8. The light emitting device of claim 1, wherein the side insulating layer extends to the top of the etching prevention layer, the side insulating layer comprising openings that expose a portion of the etching prevention layer, and each of the wires is electrically connected to the electrode through the opening of the side insulating layer.

9. The light emitting device of claim 1, wherein the side insulating layer covers portions of the upper semiconductor layer.

10. The light emitting device of claim 1, wherein the side insulating layer comprises one of SiO2, SiN, MgO, TaO, TiO2, a polymer, and a combination thereof.

11. The light emitting device of claim 1, wherein the active layer comprises one of a single quantum well and a multiple quantum well.

* * * * *